United States Patent [19]

Yoshimura

[11] 4,021,687
[45] May 3, 1977

[54] TRANSISTOR CIRCUIT FOR DEEP SATURATION PREVENTION

[75] Inventor: Masayoshi Yoshimura, Tokyo, Japan
[73] Assignee: Hitachi, Ltd., Japan
[22] Filed: Nov. 5, 1975
[21] Appl. No.: 629,625
[30] Foreign Application Priority Data
Nov. 6, 1974  Japan ............................ 49-127155
[52] U.S. Cl. ................................ 307/300; 307/313;
307/255; 357/35; 357/44; 357/48
[51] Int. Cl.² ........................................ H03K 3/33
[58] Field of Search .......... 307/255, 313, 300, 296,
307/202 R; 357/48, 35, 44; 330/207 P

[56] References Cited

UNITED STATES PATENTS

| | | | |
|---|---|---|---|
| 3,604,953 | 9/1971 | Carmody | 307/300 |
| 3,898,483 | 8/1975 | Sander et al. | 307/300 |
| 3,934,159 | 1/1976 | Nomiya et al. | 307/300 |

FOREIGN PATENTS OR APPLICATIONS 1,395,473  12/1973  United Kingdom ............... 307/255

Primary Examiner—Stanley D. Miller, Jr.
Assistant Examiner—B. P. Davis
Attorney, Agent, or Firm—Craig & Antonelli

[57] ABSTRACT

A transistor circuit which comprises a first transistor of the N-P-N type, a second transistor of the P-N-P type and a third transistor of the N-P-N type, and in which a base of the first transistor, an emitter of the second transistor and a collector of the third transistor are electrically connected with one another, while a collector of the first transistor and a base of the second transistor are electrically connected with each other, whereby the first transistor is prevented from being driven into an extremely deep saturation region.

8 Claims, 3 Drawing Figures

TRANSISTOR CIRCUIT FOR DEEP SATURATION PREVENTION

BACKGROUND OF THE INVENTION

This invention relates to a semiconductor device, and more particularly to a transistor circuit which is formed into a semiconductor integrated circuit device (IC).

When an N-P-N transistor is driven to the saturation region, the phenomenon of injection of holes from the base to the collector of the transistor takes place. Especially, where the N-P-N transistor is formed in an IC, the hole current becomes the substrate current and raises the substrate potential. This is disadvantageous in causing the parasitic effect in the adjacent N-type epitaxial island etc. In particular, when an N-P-N transistor for power as included in an IC for power is driven to an extremely deep saturation region, respective elements within the IC are affected by the saturation of the N-P-N transistor for power through a semiconductor substrate which is their common region.

On the other hand, when a transistor is driven to an extremely deep saturation region, the switching speed of the transistor lowers under the influence of minority carriers injected from the collector to the base.

There has hitherto been proposed a method for preventing a transistor from being saturated. In the method, a clamping diode (for example, metal-semiconductor contact Schottky barrier diode) which exhibits a forward voltage $V_F$ smaller in magnitude than the base-collector forward voltage $V_{BC}$ of the transistor to have its saturation prevented is connected in the forward direction between the base and collector of the transistor.

According to such known method, when an excess current flows into the base of the transistor and the transistor is going to be saturated, the excess current flows to the collector of the transistor through the clamping diode having the forward voltage $V_F$ of the smaller magnitude, with the result that the excess current is prevented from flowing into the base of the transistor. Therefore, the saturation of the transistor is preventable eventually.

On the other hand, with the known method, the collector-emitter voltage $V_{CE}$ of the transistor at the conduction of the clamping diode is given as the difference between the base-emitter voltage $V_{BE}$ of the transistor and the smaller forward voltage $V_F$ of the clamping diode, as indicated by the following equation:

$$V_{CE} = V_{BE} - V_F$$

Since the base-emitter voltage $V_{BE}$ of the transistor is approximately 0.7 – 0.75 V and the forward voltage $V_F$ of the metal-semiconductor contact Schottky barrier diode for clamp is approximately 0.4 – 0.45 V, the collector-emitter voltage $V_{CE}$ becomes approximately 0.3 – 0.35 V. This value is greater than the collector-emitter saturation voltage $V_{CE(sat)}$ (approximately 0.2 V) of the transistor which is driven to the saturation region.

In most transistor circuits, however, it is required that, when a large signal current flows into the base of a transistor and the transistor is driven into the conductive state, the collector-emitter voltage $V_{CE}$ of the transistor will become a sufficiently small value.

Therefore, the known expedient for the prevention of the saturation of the transistor as employs the clamping diode involves the disadvantage that the required property of such transistor circuits is not satisfied.

SUMMARY OF THE INVENTION

It is accordingly an object of this invention to attain a collector-emitter voltage of a transistor as small as possible and also prevent the transistor from being driven to an extremely deep saturation region in case where a signal current flows to the base of the transistor to force the transistor into the conductive state, and to thus check the occurrence of various bad influences ascribable to the drive of the transistor to the deep saturation region.

The fundamental construction of this invention for accomplishing such object is characterized in that a first transistor of a first conductivity type, a second transistor of a second conductivity type and a third transistor of the first conductivity type are comprised, and that a base of the first transistor, an emitter of the second transistor and a collector of the third transistor are electrically connected with one another, while a collector of the first transistor and a base of the second transistor are electrically connected with each other.

BRIEF DESCRIPTION OF THE DRAWING

FIGS. 1 to 3 show an IC embodying this invention, in which:

FIG. 1 is a top plan view of a part of the IC;

FIG. 2 is a sectional view of the essential portions of the embodiment; and

FIG. 3 is an equivalent circuit diagram of the semiconductor device of the embodiment.

PREFERRED EMBODIMENT OF THE INVENTION

Figure 1:
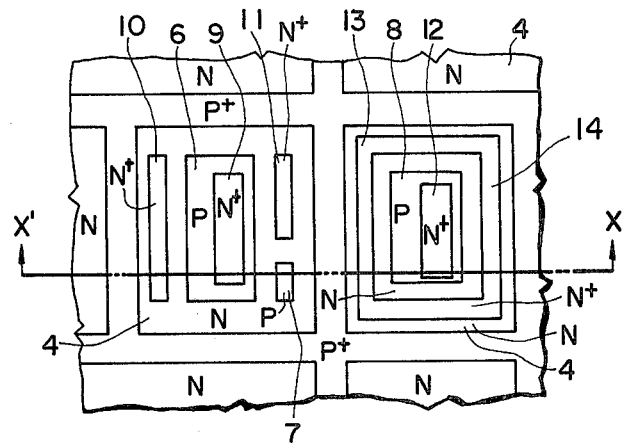

Referring to the drawing, $Q_1$ designates an N-P-N transistor, $Q_2$ a lateral P-N-P transistor, and $Q_3$ an N-P-N transistor of another island. Numeral 1 indicates a P-type silicon substrate, 2 an $N^+$-type buried layer, 3 a $P^+$-type isolation layer, 4 an N-type epitaxial layer, and 5 a silicon dioxide film. Numerals 6 to 8 represent P-type regions, while numerals 9 to 14 represent $N^+$-type regions. Numeral 15 denotes an emitter electrode of the transistor $Q_1$, 16 a base electrode of the transistor $Q_1$, 17 a collector electrode of the transistor $Q_1$, 18 a collector electrode of the transistor $Q_2$, 19 an emitter electrode of the transistor $Q_3$, 20 a base electrode of the transistor $Q_3$, and 21 a collector electrode of the transistor $Q_3$.

Figure 2:
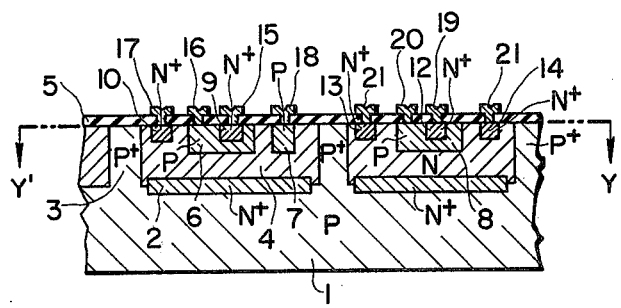

The IC which is one embodiment of this invention can be fabricated by the use of well-known manufacturing techniques for IC's. More specifically, as illustrated in FIGS. 1 and 2, the $N^+$-type buried layer 2 is formed at selected areas on the P-type silicon substrate, whereupon the N-type epitaxial layer 4 is formed thereon. Thus, the N-type epitaxial layer 4 is formed into a plurality of islands separated by the $P^+$-type isolation layer 3. Subsequently, by employing the silicon dioxide film 5 as a mask, an acceptor impurity is selectively diffused into the N-type epitaxial layer 4, to form the P-type regions 6 to 8. At the next step, by the same mask diffusion with the silicon dioxide film 5 as in the above, the $N^+$-type diffused layers are formed in the P-type region 6 to become the base of the transistor $Q_1$, in the P-type region 8 to become the base of the transistor $Q_3$ and in the N-type epitaxial layer 4 to serve as the collector regions of the transistors $Q_1$ and $Q_3$. These $N^+$-type diffused layers are made the emitter region 9 of the transistor $Q_1$ and the $N^+$-type regions 10 and 11 for leading out the collector electrode of the same transistor, and also the emitter region 12 of the transistor $Q_3$ and the $N^+$-type region 13 and 14 for leading out the collector electrode of the same transistor. Thereafter, the electrodes and interconnections of the transistors $Q_1$ to $Q_3$ are formed by the aluminum evaporation and the photoetching technique.

The IC of such construction includes in the vicinity of the N-P-N transistor $Q_1$ the lateral P-N-P transistor $Q_2$ whose emitter is the P-type region 6, whose base is the N-type epitaxial layer 4 and whose collector is the P-type region 7.

Figure 3:
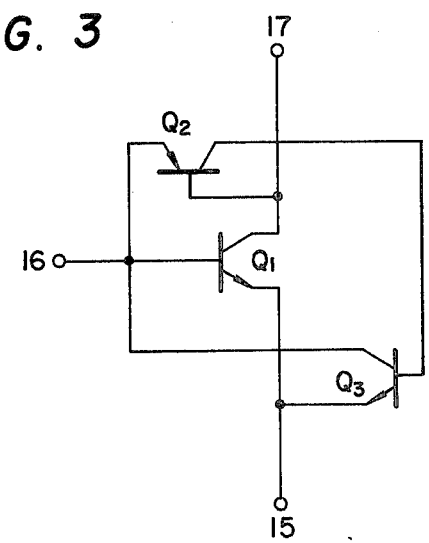

In other words, the P-type region 6 serves as the base of the N-P-N transistor $Q_1$ and simultaneously as the emitter of the lateral P-N-P transistor $Q_2$, while the N-type epitaxial layer 4 serves as the collector of N-P-N transistor $Q_1$ and simultaneously as the base of the lateral P-N-P transistor $Q_2$. As illustrated in FIG. 3, the electrical connection between the base of the N-P-N transistor $Q_1$ and the emitter of the P-N-P transistor $Q_2$ and the electrical connection between the collector of the N-P-N transistor $Q_1$ and the base of the P-N-P transistor $Q_2$ are uniquely completed by the device structure. On the other hand, the electrical connection between the base of the N-P-N transistor $Q_1$ and the collector of the N-P-N transistor $Q_3$ is completed by the aluminum interconnection on the silicon dioxide film 5 as connects between the base electrode 16 of the N-P-N transistor $Q_1$ and the collector electrode 21 of the N-P-N transistor $Q_3$. Likewise, the electrical connection between the collector of the P-N-P transistor $Q_2$ and the base of the N-P-N transistor $Q_3$ is completed by the aluminum interconnection on the silicon dioxide film 5 as connects between the collector electrode 18 of the P-N-P transistor $Q_2$ and the base electrode 20 of the N-P-N transistor $Q_3$. Further, the electrical connection between the emitter of the N-P-N transistor $Q_1$ and the emitter of the N-P-N transistor $Q_3$ is completed by the aluminum interconnection on the silicon dioxide film 5 as connects between the emitter electrode 15 of the N-P-N transistor $Q_1$ and the emitter electrode 19 of the N-P-N transistor $Q_3$.

With the device structure according to the embodiment of this invention, the base-collector junction of the N-P-N transistor $Q_1$ and the emitter-base junction of the P-N-P transistor $Q_2$ are uniquely and concurrently provided by the P-N junction which is defined between the P-type region 6 and the N-type epitaxial layer 4. Therefore, the base-collector forward voltage of the N-P-N transistor $Q_1$ and the emitter-base forward voltage of the P-N-P transistor $Q_2$ are substantially equal to each other.

In accordance with the embodiment of this invention as described above, the intended object can be achieved for reasons to be stated hereunder.

In case where, when the N-P-N transistor $Q_1$ is driven to an extremely deep saturation region, an excess injection of holes from the base to the collector of the transistor $Q_1$, the outflow of an excess hole current to the P-type silicon substrate 1 can be prevented by the action of the lateral P-N-P transistor $Q_2$. Moreover, the current having flowed out to the collector of the lateral P-N-P transistor $Q_2$ can be made the base current of the N-P-N transistor $Q_3$ of another island as seen from FIG. 3, with the result that a current which is $h_{FE}$ (the current gain of the N-P-N transistor $Q_3$) times larger than the collector current of the transistor $Q_2$ is by-passed from the base of the N-P-N transistor $Q_1$ which is provided with the lateral P-N-P transistor $Q_2$. The lateral P-N-P transistor $Q_2$ can therefore be made an element which serves for the control of the saturation characteristic of the N-P-N transistor $Q_1$ and the detection of the saturation state thereof.

This will now be explained more in detail. Under the state under which a signal current for driving the N-P-N transistor $Q_1$ into the conductive state flows into the base of this transistor and under which the N-P-N transistor $Q_1$ is driven to an appropriate and comparatively shallow saturation region, the collector-emitter voltage of the transistor $Q_1$ lowers down to a value which is very close to the collector-emitter saturation voltage $V_{CE(sat)}$. In addition, the base-collector forward voltage $V_{BC}$ of the transistor $Q_1$ under such state has a comparatively small value. Therefore, the P-N-P transistor $Q_2$ whose emitter-base junction is biased by the base-collector forward voltage $V_{BC}$ becomes substantially cut off. Since the P-N-P transistor $Q_2$ is in the cutoff state, the N-P-N transistor $Q_3$ is also in the cutoff state. Consequently, under the state under which the N-P-N transistor $Q_1$ is driven to the appropriate and comparatively shallow saturation region, neither the P-N-P transistor $Q_2$ nor the N-P-N transistor $Q_3$ exerts any influence on the signal current flowing into the base of the N-P-N transistor $Q_1$.

When the signal current flowing into the base of the N-P-N transistor $Q_1$ increases more, the degree of saturation of the transistor $Q_1$ rises, and hence, the base-collector forward voltage $V_{BC}$ of the transistor $Q_1$ augments. Then, the P-N-P transistor $Q_2$ whose emitter-base junction is biased by the base-collector forward voltage $V_{BC}$ falls into the conductive state. Under this conductive state, the collector current of the P-N-P transistor $Q_2$ flows to the base of the N-P-N transistor $Q_3$ and drives the transistor $Q_3$ into the conductive state. The collector current of the N-P-N transistor $Q_3$ becomes equal to a value which is obtained by multiplying the collector current of the P-N-P transistor $Q_2$ by the current gain $h_{FE}$ of the N-P-N transistor $Q_3$. Accordingly, when an excess signal current flows to the base of the N-P-N transistor $Q_1$ and this transistor is going to be driven to an extremely deep saturation region, the N-P-N transistor $Q_3$ by-passes the excess signal current. It is thus preventable that the N-P-N transistor $Q_1$ will be driven to the extremely deep saturation region.

As set forth above, according to this invention, the lateral P-N-P transistor is provided in the vicinity of the N-P-N transistor included in the IC. Therefore, by controlling the region to form the P-type region 7 which is the collector of the lateral P-N-P transistor, the saturation characteristic of the N-P-N transistor can be improved, and the saturation characteristic of the entire IC can accordingly be improved.

This invention is not restricted to the foregoing embodiment, but it is applicable to semiconductor devices of various aspects.

I claim:

1. A transistor circuit which comprises a first transistor of a first conductivity type, a second transistor of a second conductivity type and a third transistor of said first conductivity type, and in which a base of said first transistor, an emitter of said second transistor and a collector of said third transistor are electrically connected with one another, while a collector of said first transistor and a base of said second transistor are electrically connected with each other, and a collector of said second transistor and a base of said third transistor are electrically connected with each other.

2. The combination according to claim 1, wherein an emitter of said first transistor and an emitter of said third transistor are electrically connected with each other.

3. The combination according to claim 1, wherein said transistor circuit is a monolithic integrated circuit and said first and third transistors comprise N-P-N transistors and said second transistor comprises a lateral P-N-P transistor.

4. The combination according to claim 3, wherein said monolithic integrated circuit has at least an N-type layer, a first and a second P-type regions formed in said N-type layer, and an N$^+$-type region formed in said first P-type region, said N-type layer serves as the collector of said first transistor and simultaneously as the base of said second transistor, said first P-type region serves as the base of said first transistor and simultaneously as the emitter of said second transistor, and said second P-type region serves as the collector of said second transistor.

5. A transistor circuit comprising:
a first transistor of a first conductivity type;
a second transistor of a second conductivity type, opposite said first conductivity type; and
a third transistor of said first conductivity type; and wherein the base of said first transistor, the emitter of said second transistor and the collector of said third transistor are connected in common;
the collector of said first transistor and the base of said second transistor are connected in common; and
the collector of said second transistor and the base of said third transistor are connected in common.

6. A transistor circuit according to claim 5, wherein the emitters of said first and third transistors are connected in common.

7. The combination according to claim 6, wherein said transistor circuit is a monolithic integrated circuit and said first and third transistors comprise N-P-N transistors and said second transistor comprises a lateral P-N-P transistor.

8. The combination according to claim 7, wherein said monolithic integrated circuit has at least an N-type layer, a first and a second P-type regions formed in said N-type layer, and an N$^+$-type region formed in said first P-type region, said N-type layer serves as the collector of said first transistor and simultaneously as the base of said second transistor, said first P-type region serves as the base of said first transistor and simultaneously as the emitter of said second transistor, and said second P-type region serves as the collector of said second transistor.

* * * * *